United States Patent [19]

Matsui

[11] Patent Number: 4,813,642
[45] Date of Patent: * Mar. 21, 1989

[54] FIXATION DEVICE FOR ELECTRONIC DISPLAY

[75] Inventor: Kazuhiro Matsui, Toyoake, Japan

[73] Assignee: Kitagawa Industries Co., Ltd., Nagoya, Japan

[ * ] Notice: The portion of the term of this patent subsequent to Oct. 28, 2003 has been disclaimed.

[21] Appl. No.: 857,346

[22] Filed: Apr. 30, 1986

[30] Foreign Application Priority Data

Jun. 12, 1985 [JP] Japan .................. 60-88589[U]

[51] Int. Cl.⁴ .................................... F16L 3/08
[52] U.S. Cl. ........................ 248/221.3; 174/138 G; 248/221.4; 248/316.1; 248/500; 350/334; 361/403
[58] Field of Search ............ 248/221.3, 221.4, 222.1, 248/231.8, 316.7, 49, 63, 73, 71, 74.1, 74.5, 27.1, 273, 220.2, 231.9, 309.1, 316.1, 500, 505; 350/334; 361/400, 346, 417, 419; 174/52 FP; 339/17 C, 17 F, 125 R; 24/297, 573; 403/159, 174, 138 G, 361, 403

[56] References Cited

U.S. PATENT DOCUMENTS

| | | | |
|---|---|---|---|
| 2,541,828 | 2/1951 | Peck | 248/316.7 X |
| 3,029,057 | 4/1962 | Ferm | 248/316.7 |
| 3,058,714 | 10/1962 | Oliver | 248/316.1 X |
| 3,080,140 | 3/1963 | Eohj et al. | 248/74.1 |
| 3,347,573 | 10/1967 | Carter | 403/159 X |
| 3,501,117 | 3/1970 | Soltysik | 248/221.4 X |
| 3,802,654 | 4/1974 | Jenko et al. | 248/221.3 X |
| 3,996,500 | 12/1976 | Coules | 248/220.2 X |
| 4,012,117 | 3/1977 | Lazzery | 350/334 |
| 4,139,755 | 2/1979 | Hastings | 248/27.1 X |
| 4,264,047 | 4/1981 | Nelson | 248/73 |
| 4,422,728 | 12/1983 | Andreggi | 350/334 |
| 4,457,482 | 7/1984 | Kitagawa | 248/73 X |
| 4,467,988 | 8/1984 | Kraus | 248/74.1 X |
| 4,515,424 | 5/1985 | Sakurai | 339/17 CF X |
| 4,515,440 | 5/1985 | Mosier | 350/334 |
| 4,619,431 | 10/1986 | Matsui et al. | 174/138 GX |
| 4,650,267 | 3/1987 | Yagi | 339/17 CF |

Primary Examiner—Ramon O. Ramirez
Attorney, Agent, or Firm—Oblon, Fisher, Spivak, McClelland & Maier

[57] ABSTRACT

An electronic display fixation device fixation device which comprises a flat platelike rest (1) on which an electronic display (2) is set, holding members (4, 5) extending from each one of the opposed longitudinal edges of the rest (1) for retaining the longitudinal end of the electronic display (2), fixing members (26, 27, 28) extending from the back surface of the platelike rest (1) for fixing the platelike rest on the circuit board, a pair of attachment members which are composed of projections (E) respectively formed on at least one of the holding members (4, 5) and on the rest and insertion holes (F) to which the abovementioned projections (E) are inserted, and engaging members (H, 41, 43) for attaching the holding members (4, 5) to the platelike rest (1) so as to be pivotaly movable and for engaging the holding members (4, 5) at the position where the electronic display (2) is retained.

7 Claims, 4 Drawing Sheets

FIXATION DEVICE FOR ELECTRONIC DISPLAY

BACKGROUND OF THE INVENTION

1. Technical Field

The present invention relates to a fixation device for an electronic display, especially to a device which can easily, stably and firmly fix an electronic display on a printed circuit board of electronic apparatuses.

2. Prior Art

An electronic display such as a liquid-crystal or flourescent display tube for digitally or graphically showing a volume of sound, frequency, revolution speed, time measurement result or the like is attached to home electric appliances such as television set, radio, video tape recorder, microwave oven, stereo, and measuring instrument. Although various kinds of fixation means have been proposed, they have some problems, i.e., lack of positioning stability and requirement of much time to furnish the device due to the complicated process. As a result, the efficiency in respect to the productivity of electric appliances is decreased. A two-side sticking tape or an adhesive agent is stuck to the printed circuit board, a buffer made of chloroprene sponge is stuck to the tape or the adhesive agent, another two-side-sticking tape or adhesive agent is stuck to the buffer, the back of the electronic display is stuck to the latter two-side-sticking tape or adhesive agent, and the terminals of the electronic display are inserted into the insertion holes of the printed circuit board so as to support the electronic display.

However, such a device includes the following problems. Firstly, it is troublesome to apply an adhesive agent or remove the covering paper from a two-side-sticking tape. Especially, when the adhesive agent is used, it is apt to be influenced by the temperature while at work. Secondly, it is also difficult to attach the electronic display to the circuit board in an accurate position. When the attached display gets out of its position, the terminals must be forced to be bent. It sometimes makes impossible to insert the terminals into the insertion holes of the printed circuit board. Furthermore, some other problems are found, e.g., demounting and reattachment of the display is difficult, and the spacing height is not determined.

The object of the present invention is to provide a fixation device for an electronic display by which an electronic display can be easily and surely fixed on a printed circuit board. The present invention has a constitution for solving the abovementioned problems. The constitution is such that the fixation device includes a platelike (i.e., plate-like) rest on which the electronic display is put, holding members formed at each of opposed longitudinal edges of the rest to hold the electronic display, fixing members formed on the back surface of the platelike rest to fix the rest on the circuit board, attachment members composed of a pair of projections and insertion holes which are respectively formed on the surface of the platelike rest and on at least one of the abovementioned holding members, and engaging members for engaging the holding members at the position where the electronic display is retained by the holding members.

The platelike rest has a form corresponding to that of the electronic display, and is fixed on the printed circuit board by the fixing members such as snaps with engaging projections, the tip of each of which is shaped as an arrowhead.

The holding members are formed at each of opposed longitudinal edges of the rest so as to hold the electronic display and fix it on the platelike rest. However, at least one of the holding members is formed separately from the rest and attached to the rest by a pair of attachment members composed of projections and insertion holes. Each one of the attachment members is respectively formed on the platelike rest and the holding members, and it can pivot around the projection.

On the other hand, engaging members are formed on the platelike rest so as to fix the pivotaly movable holding members at the position where the electronic display is retained by the holding members. Therefore, the holding members are immovable even by a vibration or the like after the electronic display is retained. All the members and elements described above may be made of various kinds of plastics such as a polyamide condensation polymer or a polyester condensation polymer.

In respect to the electronic display fixation device with the abovementioned constitution according to the present invention, the display can be firmly retained by the holding members, and the platelike rest is stably fixed on the circuit board by the fixing member, thereby the positioning accuracy of the display can be improved. Furthermore, attachment and demounting of the display become much easier by handling the holding members which can pivot via the attachment members.

DETAIL DESCRIPTION OF PREFERRED EMBODIMENT

The embodiment of the present invention is hereinafter described on the basis of drawings.

Figure 1:
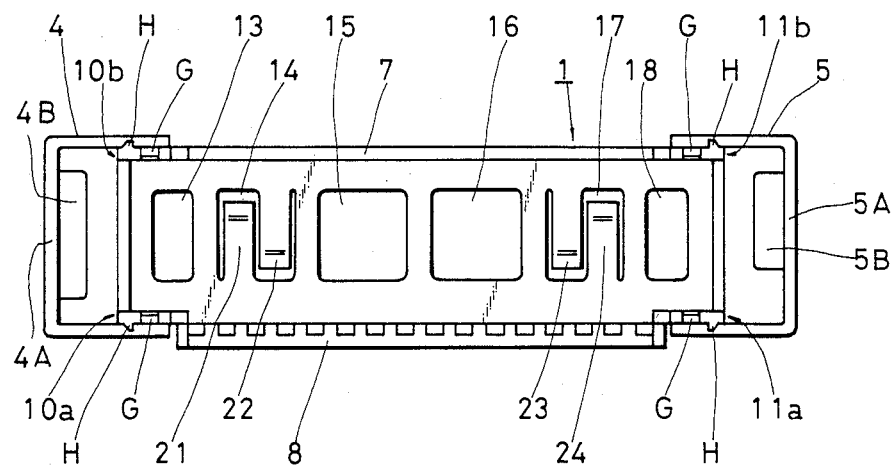
FIG. 1 shows a plan view of the fixation device of the first embodiment.
Figure 2:
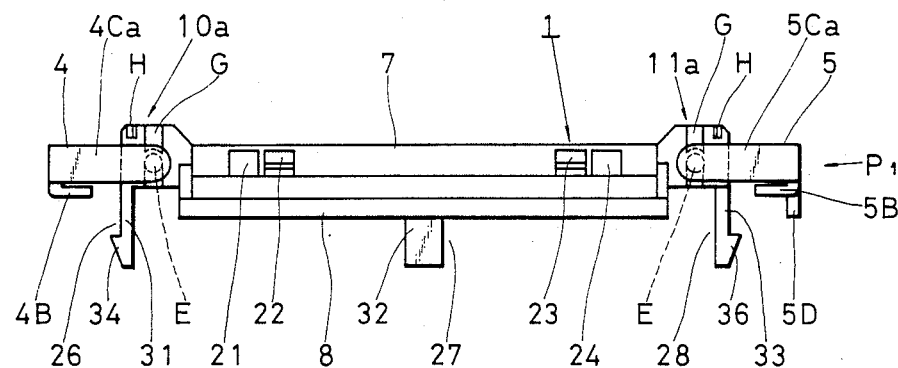
FIG. 2 denotes s a front view of the fixation device of the first embodiment.
Figure 3:
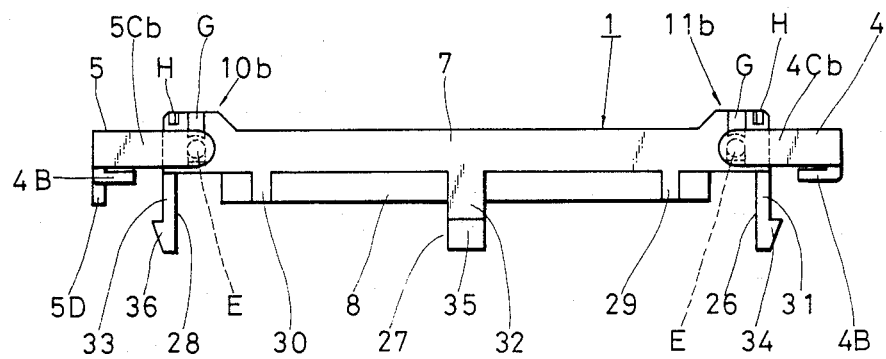
FIG. 3 illustrates a back view of the fixation device of the first embodiment.
Figure 4:
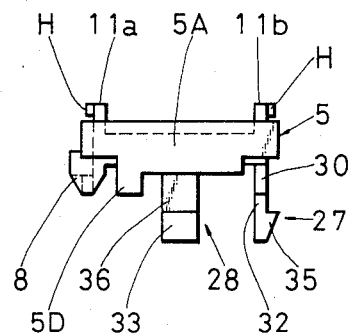
FIG. 4 is a side view of the fixation device in the direction of the arrowhead P1 in FIG. 2.
Figure 5:
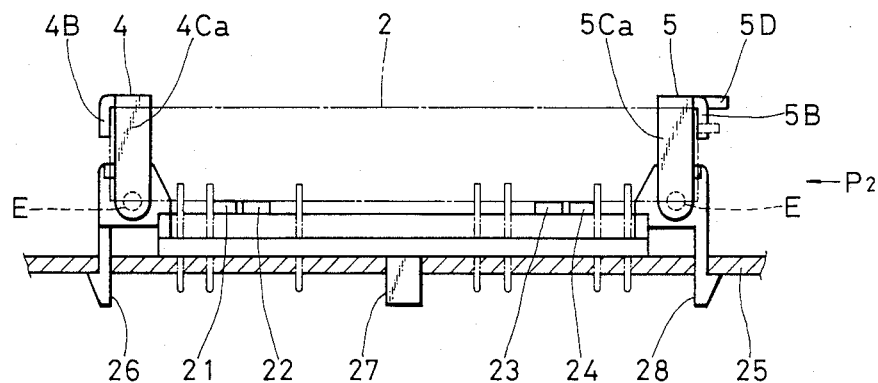
FIG. 5 illustrates a front view of the fixation device in the condition that the display is fixed.
Figure 6:
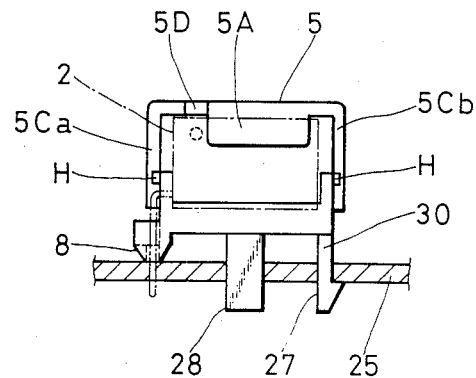
FIG. 6 is a side view of the fixation device in the direction of the arrowhead P2 in FIG. 5.
Figure 7:
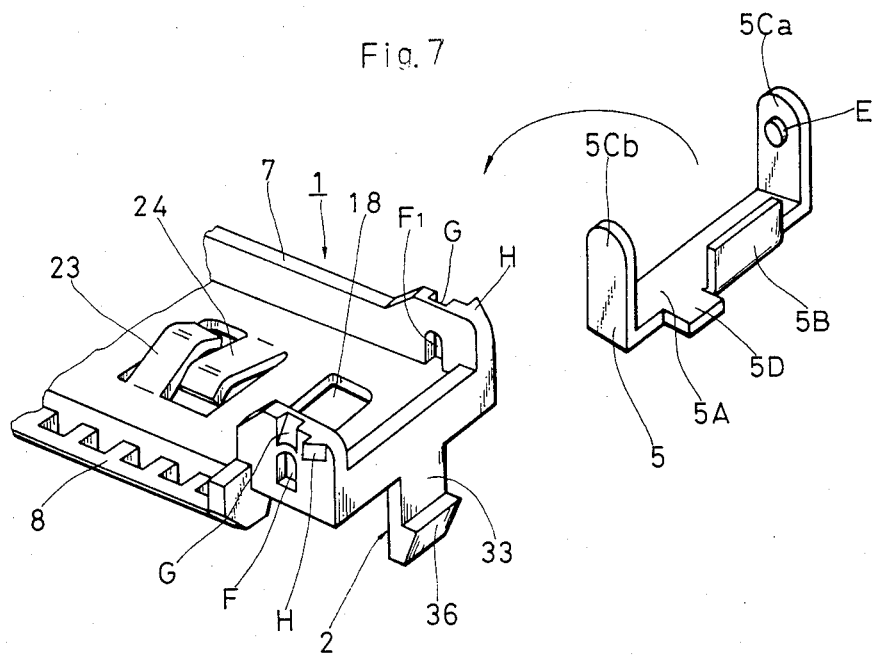
FIG. 7 denotes a partially cutaway view in perspective of the fixation device in the condition that the holding member is demounted.
Figure 8:
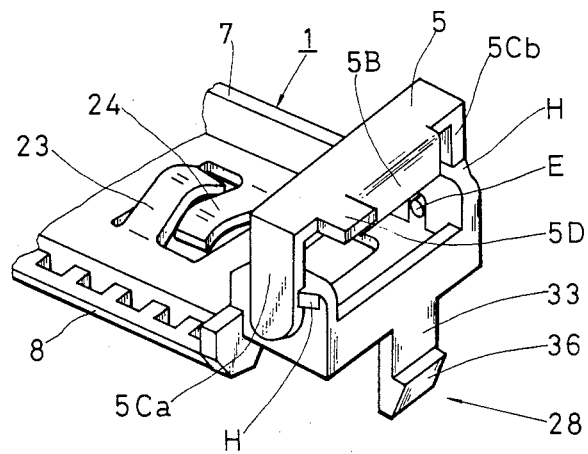
FIG. 8 shows a partially cutaway view in perspective of the fixation device in the condition that the holding member is fixed.

FIGS. 1 thru 8 denote the fixation device for an electronic display (an electronic display tube in this embodiment). FIGS. 1, 2, and 3 illustrate a plan view, a front view and a back view of the fixation device, respectively. FIG. 4 is a side view of the fixation device in the direction of the arrowhead P1 in FIG. 2. FIG. 5 denotes a front view of the fixation device in the condition that the electronic display tube is retained. FIG. 6 is a side view of the fixation device in the direction of the arrowhead P2 in FIG. 5. FIG. 7 is a perspective view illustrative of the condition of the fixation device after the holding members are demounted. FIG. 8 is a perspective view illustrative of the condition of the fixation device being furnished with the holding members.

In the drawings, numeral 1 denotes the body of the fixation device with a plain surface to which the electronic display tube 2 is placed. The fixation device is equipped with pivotaly movable holding members 4 and 5 at both longitudinal edges for retaining the electronic display tube.

The fixation device 1 is composed of a platelike rest and fixing members made of synthetic resin, and both of which are integrally formed. The wall 7 is formed on at least one of the longitudinal edges of the fixation device and contact with the longitudinal edges of the display tube for preventing the display tube from falling off. A terminal holding frame 8 with holes for guiding insertion of many terminals (lead wires) of the display tube is integrally provided at another longitudinal edges of the fixation device 1. Moreover, two pairs of attachment walls 10a, 10b and 11a, 11b are formed at both longitudinal edges of the device to attach the holding members 4 and 5 to be pivotaly movable. They are also helpful to prevent the electronic display 2 from falling off.

At the part to which the electronic display tube is attached, holes 13 thru 18 are provided so as to curtail the use of synthetic resin and to radiate the heat of the electronic display tube. Elastic support members 21 thru 24, one end of which is connected with the body of the fixation device 1, are formed at the holes 14 and 17. The elastic support members 21 thru 24 function to push up the electronic display for preventing the loose fitting of the electronic display tube 2.

At the back surface of the fixation device 1, three snaps 26 thru 28 for fixing the device on the circuit board 25 and the support legs 29 and 30 are formed as fixing members. The snaps 26 thru 28 are made up of the shanks 31 thru 33 and the check elements 34 thru 36 which are projecting from each one of the shanks.

The holding members 4 and 5 include the longitudinal frames 4A and 5A which are directly connected to the upper surface of the edge of the electronic display tube 2 on the fixation device, the end frames 4B and 5B which are contact with the edge surface of the display tube 2, and the side frames 4Ca, 4Cb, 5Ca and 5Cb which are formed at both edges of the longitudinal frames 4A and 5A, and each of which is attached to the attachment walls 10a, 10b, 11a and 11b of the fixation device 1. In addition, a protection frame 5D for a glass-made projection which is utilized when an inert gas is charged into the electronic display tube 2, is formed at the holding member 5.

The attachment walls 10a, 10b, 11a and 11b of the fixation device and the side frames 4Ca, 4Cb, 5Ca and 5Cb of the holding members 4 and 5 play important roles in the present invention. In this embodiment, as definitely shown by FIG. 7, cylindrical projections are formed at each inside surface of side frames of the holding members 4Ca, 4Cb, 5Ca and 5Cb, and the insertion holes for the abovementioned projections E are formed on the attachment walls 10a, 10b, 11a and 11b. By inserting the projections E into the holes F, the holding members 4 and 5 can pivot around the projections E. In order to smooth the insertion of the projections E, guide grooves G are formed on the external wall of the insertion holes F of the attachment walls 10a, 10b, 11a and 11b, and each tip of the projections E is tapered. As shown in FIG. 8, the engaging projections H for engaging the holding members 4 and 5 at the position where the electronic display tube 2 is retained, are formed on the external part of the attachmemt walls 10a, 10b, 11a and 11b so as to prevent the holding members 4 and 5 from loosely moving.

According to the fixation device of this embodiment having the abovementioned constitutions, the electronic display tube can be stably and accurately attached to the circuit board in a desired position. Attachment and demounting of the electronic display tube can be easily done by pivotaly turning the holding members. In addition, the holding members are easily attached to the fixation device by simply inserting the projections of the holding members into the insertion holes of the fixation device. The junctures are not easily separate by the pivotal movement of the holding members.

Figure 9:
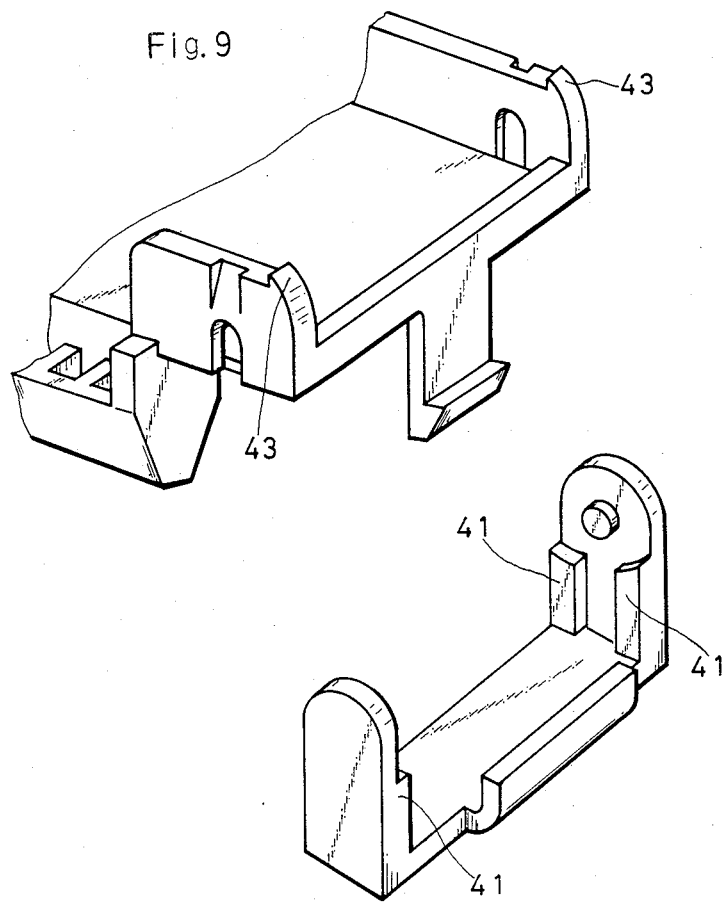
FIG. 9 is a partially cutaway view in perspective of a fixation device of another type.

Although, in the abovementioned embodiment, engaging projections are formed on the external part of the attachment wall to engage the holding members at the position where the electronic display tube is retained, another engaging means as shown in FIG. 9 is also possible. That is, the projecting walls 41 are formed at the inside surfaces of the side frames of the holding members so as to be attached to the upper side surfaces of the electronic display, and the engaging projections 43 are formed at the upper end of the attachment wall for engaging the abovementioned projecting walls 41. Thereby, the electronic display can be more stably fixed. Although, in the present embodiment, the projections are formed at the holding members and the insertion holes are formed at the body of the fixation device, it is also possible to make contrariwise the insertion holes at the holding members and the projections at the body of the fixation device. Both of them provide the same effects.

It will be understood from the above detailed description that the fixation device for an electronic display provided according to the present invention has an excellent effect that the display can be easily and exactly mounted in a desired position on the circuit board by a simple operation and the positioning accuracy can be improved. Since demounting of the electronic display is relatively easy, replacement of the defective display can be easily done.

What is claimed is:

1. A fixation device for an electronic display which comprises:
   a flat platelike rest on which an electronic display is set;
   holding members extending from each one of the opposed longitudinal edges of the platelike rest to hold the edge part of the electronic display;
   fixing members extending from a back surface of the platelike rest for fixing the platelike rest on a circuit board;
   a pair of attachment members which are composed of projections formed on at least one of the holding members and the platelike rest, and insertion holes into which said projections are inserted; and
   engaging members comprising means for fixing the holding members to the platelike rest so as to be pivotally movable, and for engaging the holding members at the position where the electronic display is retained.

2. A fixation device for an electronic display as claimed in claim 1, wherein the holding members are attached to the platelike rest in a manner so as to be freely mounted and demounted.

3. A fixation device for an electronic display as claimed in claim 2, wherein the holding members are attached to the platelike rest in a manner to pivot inwards and pass over the surface of the engaging members so as to fix the electronic display.

4. A fixation device for an electronic display as claimed in claim 1, including check elements respectively formed at each tip of the fixing members.

5. A fixation device as claimed in claim 1, including edge frames extending from the holding members and connected with the longitudinal end of the electronic display so as to fix the display.

6. A fixation device as claimed in claim 1, wherein each of the holding members has a V-shaped form.

7. A fixation device as claimed in claim 1, including guide grooves formed near the insertion holes of a pair of attachment members so as to guide the insertion of said projections.

* * * * *